(12) United States Patent
Fan et al.

(10) Patent No.: US 10,904,054 B2
(45) Date of Patent: Jan. 26, 2021

(54) SIGNAL PROCESSING METHOD AND COMMUNICATIONS CHIP STRUCTURE

(71) Applicant: HUAWEI TECHNOLOGIES CO., LTD., Guangdong (CN)

(72) Inventors: Mingjun Fan, Shanghai (CN); Jianhua Zheng, Shanghai (CN); Daiping Tang, Shanghai (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 0 days.

(21) Appl. No.: 16/750,200

(22) Filed: Jan. 23, 2020

(65) Prior Publication Data

US 2020/0162294 A1 May 21, 2020

Related U.S. Application Data

(63) Continuation of application No. PCT/CN2018/097477, filed on Jul. 27, 2018.

(30) Foreign Application Priority Data

Jul. 31, 2017 (CN) .......................... 2017 1 0640769

(51) Int. Cl.
*H04L 27/148* (2006.01)
*H04B 1/10* (2006.01)
*H04L 25/03* (2006.01)

(52) U.S. Cl.
CPC ......... *H04L 27/148* (2013.01); *H04B 1/1027* (2013.01); *H04L 25/03828* (2013.01); *H04B 2001/1072* (2013.01)

(58) Field of Classification Search
CPC H04B 1/71637; H04B 1/0475; H04B 1/7101; H04B 17/309; H04B 1/001;
(Continued)

(56) References Cited

U.S. PATENT DOCUMENTS 6,411,653 B1 * 6/2002 Arunachalam ...... H04B 1/0021
348/395.1
8,224,274 B2 7/2012 Gomez et al.
(Continued)

FOREIGN PATENT DOCUMENTS

CN 1281597 A 1/2001
CN 104935371 A 9/2015
(Continued)

*Primary Examiner* — Khanh C Tran
(74) *Attorney, Agent, or Firm* — Womble Bond Dickinson (US) LLP

(57) ABSTRACT

This application discloses a communications chip structure, including: a channel selection module, configured to receive an input signal, where the input signal is a signal of a preset narrow bandwidth span or a signal of a preset wide bandwidth span; and a digital baseband module, configured to control the channel selection module to select a first sampling and quantification channel when the input signal is a signal of the preset narrow bandwidth span, or control the channel selection module to select a second sampling and quantification channel when the input signal is a signal of the preset wide bandwidth span. The channel selection module is further configured to send the input signal to the first sampling and quantification channel or the second sampling and quantification channel for sampling and quantification.

13 Claims, 7 Drawing Sheets

(58) Field of Classification Search
CPC ....... H04B 1/0017; H04B 1/1027; H04L 5/06; H04L 25/03834; H04L 27/2647; H04L 27/38; H04L 27/148; H04L 25/03828
See application file for complete search history.

(56) References Cited

U.S. PATENT DOCUMENTS

| | | | |
|---|---|---|---|
| 2002/0097821 A1* | 7/2002 | Hebron | H04B 1/1036 |
| | | | 375/346 |
| 2005/0197068 A1 | 9/2005 | Gumm | |
| 2007/0268961 A1* | 11/2007 | Lin | H03D 7/165 |
| | | | 375/152 |
| 2008/0018427 A1* | 1/2008 | Ezra | H04L 1/22 |
| | | | 340/7.32 |
| 2008/0171510 A1* | 7/2008 | Aizawa | H04B 1/3805 |
| | | | 455/3.02 |
| 2013/0021934 A1* | 1/2013 | Rugamer | G01S 19/32 |
| | | | 370/252 |
| 2013/0028308 A1* | 1/2013 | Tay | H04L 27/38 |
| | | | 375/224 |
| 2013/0147521 A1 | 6/2013 | Ling | |

FOREIGN PATENT DOCUMENTS

| | | |
|---|---|---|
| CN | 106533518 A | 3/2017 |
| WO | 2006096217 A2 | 9/2006 |

* cited by examiner

SIGNAL PROCESSING METHOD AND COMMUNICATIONS CHIP STRUCTURE

CROSS-REFERENCE TO RELATED APPLICATIONS

This application is a continuation of International Application No. PCT/CN2018/097477, filed on Jul. 27, 2018, which claims priority to Chinese Patent Application No. 201710640769.3, filed on Jul. 31, 2017, The disclosures of the aforementioned applications are hereby incorporated by reference in their entireties.

TECHNICAL FIELD

This application relates to the field of communications technologies, and in particular, to a signal processing method and a communications chip structure.

BACKGROUND

As mobile communications technologies develop, mobile terminals (such as mobile phones) need to support standards of 2G, 3G, 4G (LTE-Advanced), and future 5G. For 2G, 3G, and 4G single-carrier and 4G continuous multi-carrier scenarios, signals are in one band or neighboring bands. Therefore, a low-bandwidth continuous time sigma-delta analog-to-digital converter (CT Sigma-delta ADC) (bandwidth lower than 200 MHz) is used in most mobile terminal chips to sample and quantify received signals. For scenarios of 5G and discontinuous carrier aggregation (CA) across 4G bands, a chip needs a plurality of low-bandwidth analog-to-digital converters (ADC) to sample and quantify signals.

A first embodiment to sample and quantify signals in different CA bands is to sample and quantify the signals using a combination of two or more receive channels, where one receive channel includes one CT sigma-delta ADC. However, in use of the first implementation, the plurality of low-bandwidth ADCs have encountered chip area and power consumption bottlenecks of a chip. Therefore, a second implementation is used, that is, to sample and quantify signals using one radio frequency ADC (RFADC).

When the second implementation is used, technologically, the RFADC is unable to support wide-bandwidth input in scenarios of 5G and discontinuous CA across 4G bands and also meet requirements of high linearity in 2G scenarios.

SUMMARY

Embodiments of this application provide a signal processing method and a communications chip structure. A sampling channel supporting signals of a preset narrow bandwidth span and signals of a preset wide bandwidth span is provided, so that a communications chip structure can not only support large-bandwidth input in scenarios of 5G and discontinuous CA across 4G bands but also meet requirements of high linearity in 2G scenarios, with lower power consumption and s smaller area.

A first aspect of this application provides a communications chip structure, including:

a digital baseband module, a channel selection module, a first sampling and quantification channel, and a second sampling and quantification channel, where the first sampling and quantification channel is configured to sample and quantify signals of a preset narrow bandwidth span; and the second sampling and quantification channel is configured to sample and quantify signals of a preset wide bandwidth span;

the first sampling and quantification channel and the second sampling and quantification channel are connected to the channel selection module and the digital baseband module, and the channel selection module is connected to the digital baseband module;

the channel selection module is configured to receive an input signal, where the input signal is a signal of the preset narrow bandwidth span or a signal of the preset wide bandwidth span;

the digital baseband module is configured to control the channel selection module to select the first sampling and quantification channel when the input signal is a signal of the preset narrow bandwidth span;

the digital baseband module is also configured to control the channel selection module to select the second sampling and quantification channel when the input signal is a signal of the preset wide bandwidth span; and the channel selection module is also configured to send the input signal to the first sampling and quantification channel or the second sampling and quantification channel, so that the first sampling and quantification channel or the second sampling and quantification channel samples and quantifies the input signal.

The communications chip structure includes the digital baseband module, the channel selection module, the first sampling and quantification channel, and the second sampling and quantification channel. The first sampling and quantification channel is configured to sample and quantify signals of the preset narrow bandwidth span, where a signal of the preset narrow bandwidth span may specifically be a signal in a 2G, 3G, 4G single-carrier, or 4G continuous CA scenario. Signal bandwidth spans in these scenarios are relatively narrow, generally less than 200 MHz. Therefore, a criterion for a signal of the preset narrow bandwidth span may be a preset narrow bandwidth span less than 200 MHz. The second sampling and quantification channel is configured to sample and quantify signals of the preset wide bandwidth span, where a signal of the preset wide bandwidth span may specifically be a signal in a scenario of 5G or discontinuous CA across 4G bands. Signal bandwidth spans in the scenarios of 5G and discontinuous CA across 4G bands are relatively large, definitely larger than that of a signal of the preset narrow bandwidth span. The first sampling and quantification channel and the second sampling and quantification channel are connected to the channel selection module and the digital baseband module, and the channel selection module is connected to the digital baseband module. The channel selection module is configured to receive the input signal, where the input signal is a signal of the preset narrow bandwidth span or a signal of the preset wide bandwidth span. The digital baseband module distributes the input signal to the first sampling and quantification channel or the second sampling and quantification channel for processing, based on the scenario of the input signal. Specifically, the digital baseband module controls the channel selection module to select the first sampling and quantification channel when the input signal is a signal of the preset narrow bandwidth span, and controls the channel selection module to select the second sampling and quantification channel when the input signal is a signal of the preset wide bandwidth span signal. Equivalent to a selection switch, the channel selection module is connected to the first sampling and quantification channel or the second sampling and quantification channel, and sends the input signal to the first sampling and quantification channel or the second sampling and quantification channel. In this way, when the input signal is a signal of the preset narrow bandwidth span, the first sampling and quantification channel can sample and quantify the signal of the preset narrow bandwidth span, while the second sampling and quantification channel does not need to perform any processing. Compared with the prior-art first implementation, such implementation has the same power consumption and performance. When the input signal is a signal of the preset wide bandwidth span, the second sampling and quantification channel can sample and quantify the signal of the preset wide bandwidth span, while the first sampling and quantification channel does not need to perform any processing. Compared with the prior-art second implementation, such implementation does not need to support requirements of high linearity in 2G scenarios, but only needs to support large-bandwidth input, reducing power consumption and an area of the second sampling and quantification channel. Therefore, the communications chip structure can not only support large-bandwidth input in scenarios of 5G and discontinuous CA across 4G bands, but also meet the requirements of high linearity in 2G scenarios, with lower power consumption and a smaller area.

In some embodiments, the first sampling and quantification channel includes:

a low pass filter unit and a low-bandwidth analog-to-digital converter unit, where the low pass filter unit is connected to the channel selection module and the low-bandwidth analog-to-digital converter unit;

the low pass filter unit is configured to filter the input signal; and the low-bandwidth analog-to-digital converter unit is configured to sample and quantify the filtered input signal.

Because the first sampling and quantification channel is configured to process signals of the preset narrow bandwidth span, and a signal of the preset narrow bandwidth span may specifically be a signal in a 2G, 3G, 4G single-carrier (Single Carrier), or 4G continuous CA scenario, the first sampling and quantification channel needs to include the low pass filter unit and the low-bandwidth analog-to-digital converter unit. The low pass filter unit is configured to filter the input signal to remove an interference signal, and the low-bandwidth analog-to-digital converter unit is configured to sample and quantify the filtered input signal.

In some embodiments, the low-bandwidth analog-to-digital converter unit is a CT sigma-delta ADC.

In some embodiments, due to sampling techniques and $\Sigma$-$\Delta$ modulation techniques, a proportion of digital circuits in a system can be increased, a proportion of analog circuits can be decreased, and monolithic integration with a digital system is easy to implement. Because a high-precision A/D converter can be achieved at relatively low costs, using a CT sigma-delta ADC as the low-bandwidth analog-to-digital converter unit may be an optimal choice.

In some embodiments, the second sampling and quantification channel includes:

an RFADC, configured to sample and quantify the input signal.

Because the second sampling and quantification channel processes signals of the preset wide bandwidth span, the second sampling and quantification channel may specifically use the RFADC, where the RFADC can perform digital quantification for a signal bandwidth of hundreds of MHz.

In some embodiments, the communications chip structure further includes:

a filter module, a gain tuning module, a mixer module, and a signal adder module, where the filter module is connected to the gain tuning module, and the gain tuning module is connected to the digital baseband module and the channel selection module; the mixer module is between the channel selection module and the first sampling and quantification channel, and the signal adder module is between the channel selection module and the second sampling and quantification channel;

the filter module is configured to receive an original signal, and filter the original signal to obtain at least one sub-signal, where none of the at least one sub-signal shares a same band;

the gain tuning module is configured to receive the at least one sub-signal;

the digital baseband module is further configured to control a gain tuning operation of the gain tuning module;

the gain tuning module is further configured to tune a gain of the at least one sub-signal based on the gain tuning operation to obtain an input signal, and send the input signal to the channel selection module, where the input signal includes at least one input sub-signal;

the mixer module is configured to receive the input signal sent by the channel selection module, and modulate a frequency band of the input signal to a baseband; and the signal adder module is configured to receive the input signal sent by the channel selection module, and add up at least one input sub-signal of the input signal.

In some embodiments, the input signal can be directly sampled and quantified by the first sampling and quantification channel and the second sampling and quantification channel. In some embodiments, the original signal cannot be directly used for sampling and quantification. Therefore, the communications chip structure further includes the filter module, the gain tuning module, the mixer module, and the signal adder module. The filter module receives the original signal, and filters the original signal to obtain at least one sub-signal, where none of the at least one sub-signal share a same band. Generally, the filtering may be performed according to a rule of low band, medium band, high band, and ultra-high band, to obtain four sub-signals. The gain tuning module receives the at least one sub-signal, and sends the at least one sub-signal to the digital baseband module. The digital baseband module controls the gain tuning operation of the gain tuning module. The gain tuning module tunes the gain of the at least one sub-signal based on the gain tuning operation to obtain the input signal, and sends the input signal to the channel selection module, where the input signal includes at least one input sub-signal. The mixer module receives the input signal sent by the channel selection module, and modulates the frequency band of the input signal to the baseband, for convenience of the first sampling and quantification channel to perform sampling and quantification. The signal adder module receives the input signal sent by the channel selection module, and adds up the at least one input sub-signal for convenience of the second sampling and quantification channel to perform sampling and quantification.

In some embodiments, the filter unit includes N filters, the gain tuning module includes N gain tuning units, the channel selection module includes N selection switches, the mixer module includes N mixers, and the first sampling and quantification channel includes N low pass filter units and N low-bandwidth analog-to-digital converter units.

It is assumed that the filter module specifically includes N filters. Then, in filtering the original signal to obtain N sub-signals, gain tuning needs to be performed on each sub-signal. Therefore, the gain tuning module includes N gain tuning units, corresponding to channel selection functions of the channel selection module, where the channel selection module includes N selection switches. When the channel selection module selects the first sampling and quantification channel, one selection switch outputs one sub-signal to one mixer in the mixer module, where the mixer module includes N mixers. The first sampling and quantification channel samples and quantifies each input sub-signal of the input signal separately. Therefore, the first sampling and quantification channel includes N low pass filter units and N low-bandwidth analog-to-digital converter units.

A second aspect of this application provides a signal processing method, applied to a communications chip structure, where the communications chip structure includes a digital baseband module, a channel selection module, a first sampling and quantification channel, and a second sampling and quantification channel, where the first sampling and quantification channel is configured to sample and quantify signals of a preset narrow bandwidth span, and the second sampling and quantification channel is configured to sample and quantify signals of a preset wide bandwidth span, and the signal processing method includes:

receiving, by the channel selection module, an input signal, where the input signal is a signal of the preset narrow bandwidth span or a signal of the preset wide bandwidth span; and sending, by the digital baseband module, a first control signal to the channel selection module when the digital baseband module detects that the input signal is a signal of the preset narrow bandwidth span, sending, by the channel selection module, the input signal to the first sampling and quantification channel according to the first control signal, and sampling and quantifying, by the first sampling and quantification channel, the input signal; or sending, by the digital baseband module, a second control signal to the channel selection module when the digital baseband module detects that the input signal is a signal of the preset wide bandwidth span, sending, by the channel selection module, the input signal to the second sampling and quantification channel according to the second control signal, and sampling and quantifying, by the second sampling and quantification channel, the input signal.

The communications chip structure includes the digital baseband module, the channel selection module, the first sampling and quantification channel, and the second sampling and quantification channel. The first sampling and quantification channel is configured to sample and quantify signals of the preset narrow bandwidth span, where a signal of the preset narrow bandwidth span may specifically be a signal in a 2G, 3G, 4G single-carrier, or 4G continuous CA scenario. Signal bandwidth spans in these scenarios are relatively narrow, generally less than 200 MHz. Therefore, a criterion for a signal of the preset narrow bandwidth span may be a preset narrow bandwidth span less than 200 MHz. The second sampling and quantification channel is configured to sample and quantify signals of the preset wide bandwidth span, where a signal of the preset wide bandwidth span may specifically be a signal in a scenario of 5G or discontinuous CA across 4G bands. Signal bandwidth spans in scenarios of 5G and discontinuous CA across 4G bands are relatively large, definitely larger than that of a signal of the preset narrow bandwidth span. The channel selection module receives the input signal, where the input signal is a signal of the preset narrow bandwidth span or a signal of the preset wide bandwidth span. When the digital baseband module detects that the input signal is a signal of the preset narrow bandwidth span, the digital baseband module sends the first control signal to the channel selection module, the channel selection module sends the input signal to the first sampling and quantification channel according to the first control signal, and the first sampling and quantification channel samples and quantifies the input signal. When the digital baseband module detects that the input signal is a signal of the preset wide bandwidth span, the digital baseband module sends the second control signal to the channel selection module, the channel selection module sends the input signal to the second sampling and quantification channel according to the second control signal, and the second sampling and quantification channel samples and quantifies the input signal. In this way, when the input signal is a signal of the preset narrow bandwidth span, the first sampling and quantification channel can sample and quantify the signal of the preset narrow bandwidth span, while the second sampling and quantification channel does not need to perform any processing. Compared with the prior-art first implementation, such implementation has same power consumption and performance. When the input signal is a signal of the preset wide bandwidth span, the second sampling and quantification channel can sample and quantify the signal of the preset wide bandwidth span, while the first sampling and quantification channel does not need to perform any processing. Compared with the prior-art second implementation, such implementation does not need to support requirements of high linearity in 2G scenarios, but only needs to support large-bandwidth input, reducing power consumption and an area of the second sampling and quantification channel. Therefore, the communications chip structure can not only support large-bandwidth input in scenarios of 5G and discontinuous CA across 4G bands, but also meet the requirements of high linearity in 2G scenarios, with lower power consumption and a smaller area.

In some embodiments, the first sampling and quantification channel includes a low pass filter unit and a low-bandwidth analog-to-digital converter unit; and the sampling and quantifying, by the first sampling and quantification channel, the input signal includes:

filtering, by the low pass filter unit, the input signal; and sampling and quantifying, by the low-bandwidth analog-to-digital converter unit, the filtered input signal.

Because the first sampling and quantification channel is configured to process signals of the preset narrow bandwidth span, and a signal of the preset narrow bandwidth span may specifically be a signal in a 2G, 3G, 4G single-carrier, or 4G continuous CA scenario, the first sampling and quantification channel needs to include the low pass filter unit and the low-bandwidth analog-to-digital converter unit. The low pass filter unit is configured to filter the input signal to remove an interference signal, and the low-bandwidth analog-to-digital converter unit is configured to sample and quantify the filtered input signal.

In some embodiments, the low-bandwidth analog-to-digital converter unit is a CT sigma-delta ADC.

In some embodiments, due to sampling techniques and Σ-Δ modulation techniques, a proportion of digital circuits in a system can be increased, a proportion of analog circuits can be decreased, and monolithic integration with a digital system is easy to implement. Because a high-precision A/D converter can be achieved at relatively low costs, using a CT sigma-delta ADC as the low-bandwidth analog-to-digital converter unit may be an optimal choice.

In some embodiments, the second sampling and quantification channel includes an RFADC; and the sampling and quantifying, by the second sampling and quantification channel, the input signal includes:

sampling and quantifying, by the RFADC, the input signal.

Because the second sampling and quantification channel processes signals of the preset wide bandwidth span, the second sampling and quantification channel may specifically use the RFADC, where the RFADC can perform digital quantification for a signal bandwidth of hundreds of MHz.

In some embodiments, the communications chip structure further includes a filter module, a gain tuning module, and a mixer module; and before the receiving, by the channel selection module, an input signal, the method further includes:

receiving, by the filter module, an original signal, and filtering the original signal to obtain at least one sub-signal, where none of the at least one sub-signal shares a same band;

receiving, by the gain tuning module, the at least one sub-signal;

sending, by the digital baseband module, a third control signal to the gain tuning module, where the third control signal is used to control a gain tuning operation of the gain tuning module; and tuning, by the gain tuning module, a gain of the at least one sub-signal based on the gain tuning operation to obtain an input signal, and sending the input signal to the channel selection module, where the input signal includes at least one input sub-signal.

In some embodiments, the input signal is not obtained directly. Generally, what the communications chip structure obtains is an original signal. In some embodiments, the original signal cannot be directly sampled and quantified. Therefore, the communications chip structure further includes the filter module, the gain tuning module, and the mixer module. Before the channel selection module receives the input signal, the filter module receives the original signal, and filters the original signal to obtain at least one sub-signal, where none of the at least one sub-signal share a same band. Generally, the filtering may be performed according to a rule of low band, medium band, high band, and ultra-high band, to obtain four sub-signals. The gain tuning module receives the at least one sub-signal. The digital baseband module sends the third control signal to the gain tuning module, where the third control signal is used to control the gain tuning operation of the gain tuning module. The gain tuning module tunes the gain of the at least one sub-signal based on the gain tuning operation to obtain the input signal, and sends the input signal to the channel selection module, where the input signal includes at least one input sub-signal.

In some embodiments, the communications chip structure further includes a mixer module; and before the sampling and quantifying, by the first sampling and quantification channel, the input signal, the method further includes:

receiving, by the mixer module, the input signal sent by the channel selection module, and modulating a frequency band of the input signal to a baseband.

Before the first sampling and quantification channel samples and quantifies the input signal, because the frequency band of the input signal is not the same as the baseband of the digital baseband module, band mixing needs to be performed to facilitate the sampling and quantification. Specifically, such mixing may be that the mixer module receives the input signal sent by the channel selection module, and modulates the frequency band of the input signal to the baseband.

In some embodiments, the communications chip structure further includes a signal adder module; and before the sampling and quantifying, by the second sampling and quantification channel, the input signal, the method further includes:

receiving, by the signal adder module, the input signal sent by the channel selection module, and adding up at least one input sub-signal of the input signal.

Before the second sampling and quantification channel samples and quantifies the input signal, because the input signal includes a plurality of input sub-signals, the plurality of input sub-signals need to be added up into one signal to facilitate the sampling and quantification. Specifically, such addition may be that the signal adder module receives the input signal sent by the channel selection module, and adds up the at least one input sub-signal of the input signal.

DESCRIPTION OF EMBODIMENTS

Embodiments of this application provide a signal processing method and a communications chip structure. A sampling channel supporting signals of a preset narrow bandwidth span and signals of a preset wide bandwidth span is provided, so that a communications chip structure can not only support large-bandwidth input in scenarios of 5G and discontinuous CA across 4G bands, but also meet requirements of high linearity in 2G scenarios, with lower power consumption and a smaller area.

The following describes the technical solutions in the embodiments of this application with reference to the accompanying drawings in the embodiments of this application. Apparently, the described embodiments are merely some but not all of the embodiments of this application. All other embodiments obtained by a person skilled in the art based on the embodiments of this application without creative efforts shall fall within the protection scope of this application.

Figure 1:
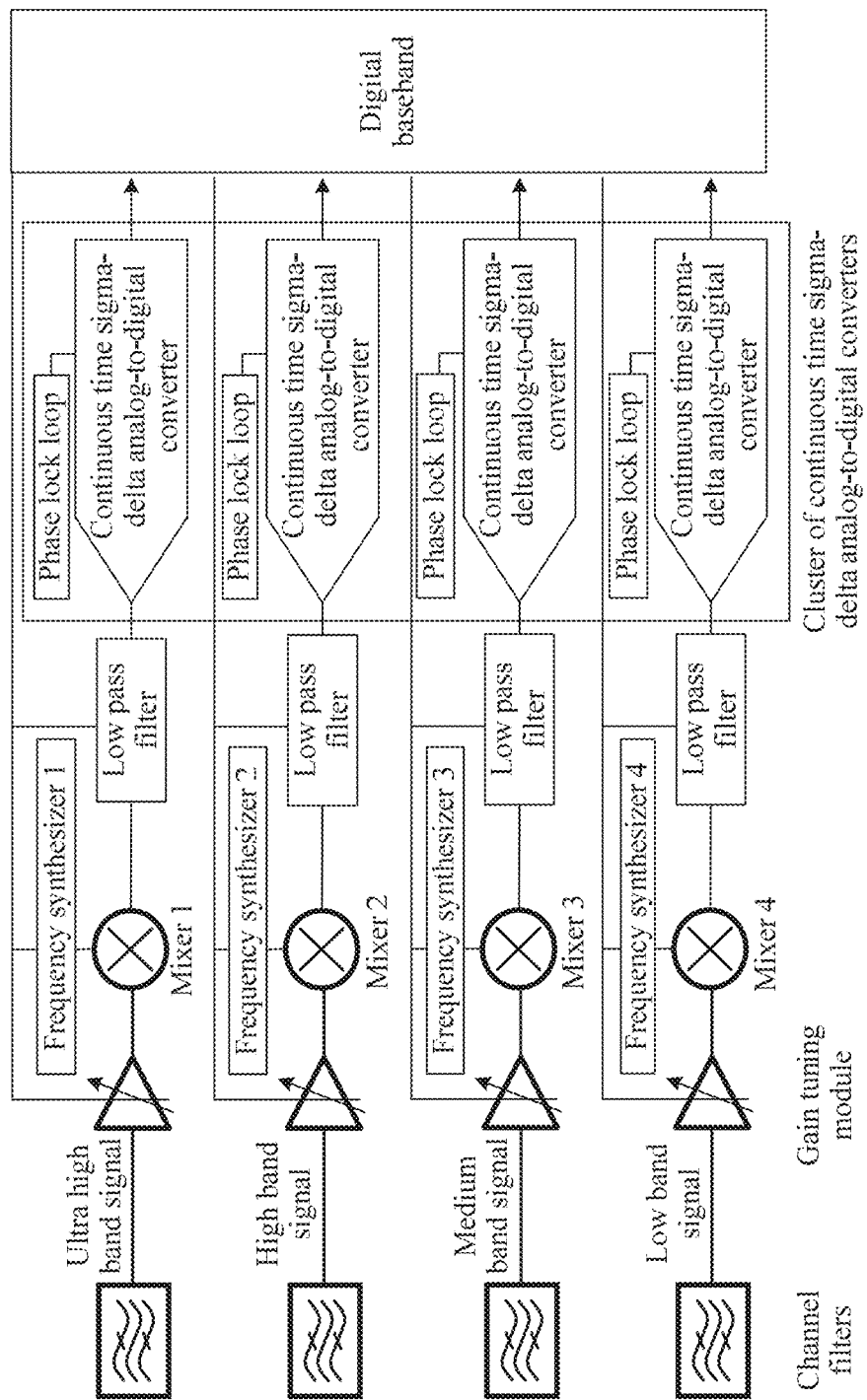
FIG. 1 is a schematic structural diagram of a prior-art communications chip structure according to this application.
Figure 2:
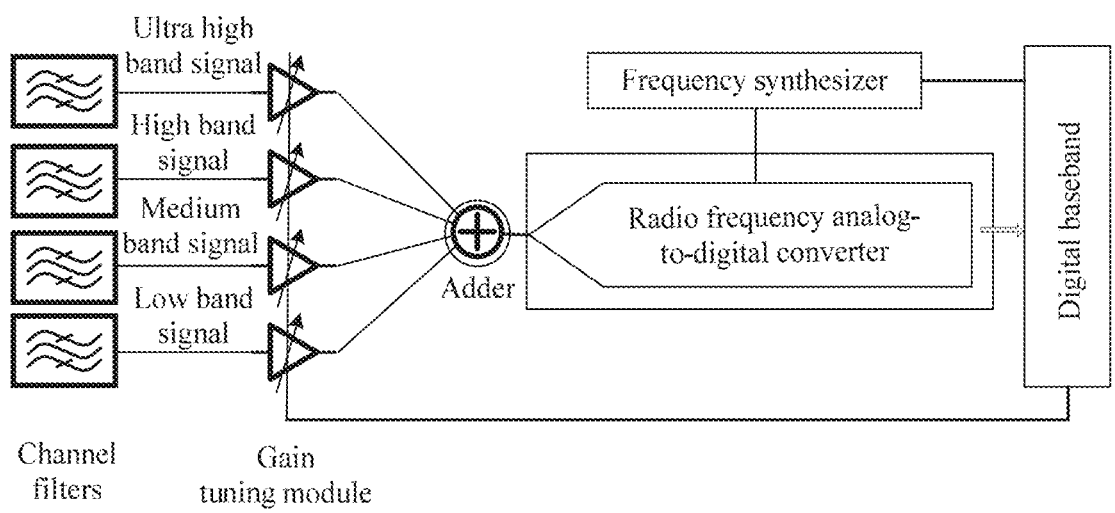
FIG. 2 is a schematic structural diagram of another prior-art communications chip structure according to this application.

Mobile terminals need to support 2G, 3G, 4G, and future 5G standards. For 2G, 3G, 4G single-carrier, and 4G continuous multi-carrier scenarios, signals are in one band or in neighboring bands. Therefore, a CT sigma-delta ADC is used in most chips of mobile terminal to sample and quantify signals. For scenarios of 5G and discontinuous CA across 4G bands, a chip needs a plurality of ADCs to sample and quantify signals. FIG. 1 shows a first implementation of signal sampling and quantification across different CA bands. As shown in FIG. 1, four channel filters may divide an original signal into four band signals, including a low band signal (LB), a medium band signal (MB), a high band signal (HB), and an ultra-high band signal (UHB). Each signal is amplified using a gain tuning module, and modulated to a baseband using a mixer. After passing a low pass filter (LPF), each signal is sampled and quantified by one CT sigma-delta ADC. A frequency synthesizer provides a local oscillator clock for the mixer, the gain tuning and the LPF are controlled by a DBB, a phase lock loop (PLL) provides a working clock for the CT sigma-delta ADC, and finally, the digital baseband (DBB) obtains sampled and quantified data. A quantity of the CT sigma-delta ADCs varies with a quantity of the channel filters. However, as increasingly higher downlink throughputs are required in wireless communications, using a plurality of CT sigma-delta ADCs has encountered bottlenecks of chip area and power consumption of a chip. FIG. 2 shows a second implementation. Four band signals are added up into one signal using a signal adder, and the one signal is sampled and quantified by one RFADC. A frequency synthesizer provides a local oscillator clock for the RFADC. Compared with the first implementation, the second implementation has advantages in both chip area and power consumption. However, according to the status quo of development of RFADCs in academia and the industry, RFADCs are still not mature enough to both support large-bandwidth input in scenarios of 5G and discontinuous CA across 4G bands and meet requirements of high linearity in 2G scenarios.

Figure 3:
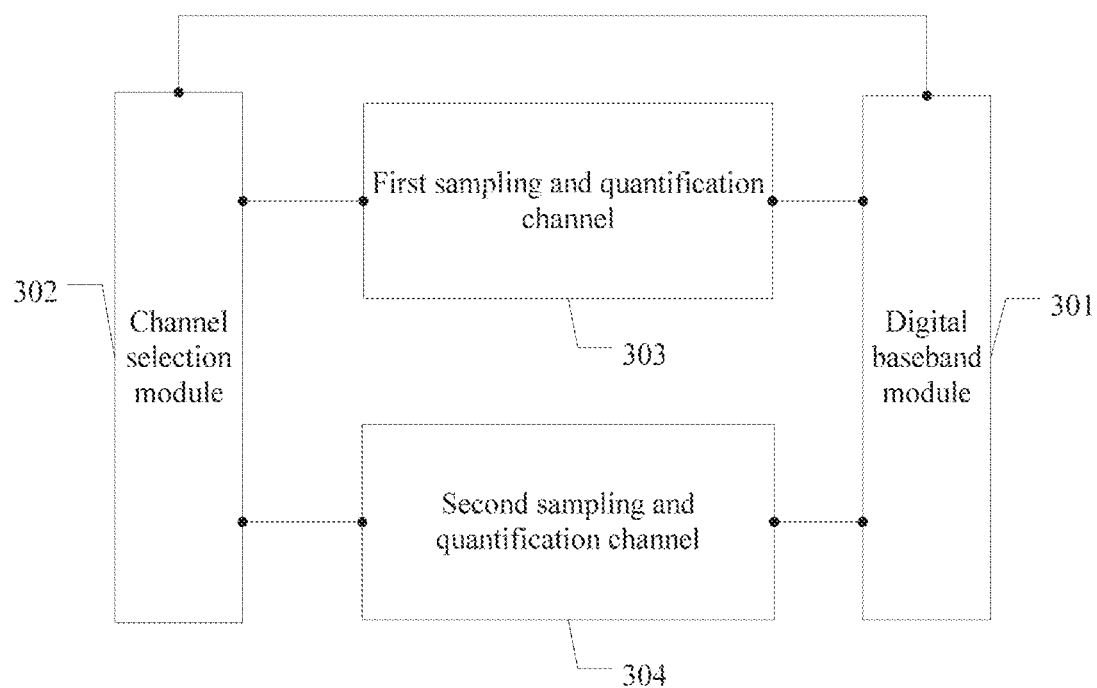
FIG. 3 is a schematic structural diagram of an embodiment of a communications chip structure according to this application.

To resolve the foregoing problem, an embodiment of this application provides a communications chip structure shown in FIG. 3, including:

a digital baseband module 301, a channel selection module 302, a first sampling and quantification channel 303, and a second sampling and quantification channel 304, where the first sampling and quantification channel 303 is configured to sample and quantify signals of a preset narrow bandwidth span, and the second sampling and quantification channel 304 is configured to sample and quantify signals of a preset wide bandwidth span;

the first sampling and quantification channel 303 and the second sampling and quantification channel 304 are connected to the channel selection module 302 and the digital baseband module 301, and the channel selection module 302 is connected to the digital baseband module 301;

the channel selection module 302 is configured to receive an input signal, where the input signal is a signal of the preset narrow bandwidth span or a signal of the preset wide bandwidth span;

the digital baseband module 301 is configured to control the channel selection module 302 to select the first sampling and quantification channel 303 when the input signal is a signal of the preset narrow bandwidth span;

the digital baseband module 301 is further configured to control the channel selection module 302 to select the second sampling and quantification channel 304 when the input signal is a signal of the preset wide bandwidth span; and the channel selection module 302 is further configured to send the input signal to the first sampling and quantification channel 303 or the second sampling and quantification channel 304, so that the first sampling and quantification channel 303 or the second sampling and quantification channel 304 samples and quantifies the input signal.

In this embodiment of this application, the communications chip structure includes the digital baseband module 301, the channel selection module 302, the first sampling and quantification channel 303, and the second sampling and quantification channel 304. The first sampling and quantification channel 303 is configured to sample and quantify signals of the preset narrow bandwidth span, where a signal of the preset narrow bandwidth span may specifically be a signal in a 2G, 3G, 4G single-carrier, or 4G continuous CA scenario. Signal bandwidth spans in these scenarios are relatively narrow, generally less than 200 MHz. Therefore, a criterion for a signal of the preset narrow bandwidth span may be a preset narrow bandwidth span less than 200 MHz. The second sampling and quantification channel 304 is configured to sample and quantify signals of the preset wide bandwidth span, where a signal of the preset wide bandwidth span may specifically be a signal in a scenario of 5G or discontinuous CA across 4G bands. Signal bandwidth spans in the scenarios of 5G and discontinuous CA across 4G bands are relatively large, definitely larger than that of a signal of the preset narrow bandwidth span. The first sampling and quantification channel 303 and the second sampling and quantification channel 304 are connected to the channel selection module 302 and the digital baseband module 301, and the channel selection module 302 is connected to the digital baseband module 301. The channel selection module 302 is configured to receive the input signal, where the input signal is a signal of the preset narrow bandwidth span or a signal of the preset wide bandwidth span. The digital baseband module 301 distributes the input signal to the first sampling and quantification channel or the second sampling and quantification channel for processing, based on a scenario of the input signal. Specifically, the digital baseband module 301 controls the channel selection module 302 to select the first sampling and quantification channel 303 when the input signal is a signal of the preset narrow bandwidth span, and controls the channel selection module 302 to select the second sampling and quantification channel 304 when the input signal is a signal of the preset wide bandwidth span signal. Equal to a selection switch, the channel selection module 302 is connected to the first sampling and quantification channel 303 or the second sampling and quantification channel 304, and sends the input signal to the first sampling and quantification channel 303 or the second sampling and quantification channel 304. In this way, when the input signal is a signal of the preset narrow bandwidth span, the first sampling and quantification channel 303 can sample and quantify the signal of the preset narrow bandwidth span, while the second sampling and quantification channel 304 does not need to perform any processing. Compared with the prior-art first implementation, such implementation has the same power consumption and performance. When the input signal is a signal of the preset wide bandwidth span, the second sampling and quantification channel 304 can sample and quantify the signal of the preset wide bandwidth span, while the first sampling and quantification channel 303 does not need to perform any processing. Compared with the prior-art second implementation, such implementation does not need to support requirements of high linearity in 2G scenarios, but only needs to support large-bandwidth input, reducing power consumption and an area of the second sampling and quantification channel. Therefore, the communications chip structure can not only support large-bandwidth input in scenarios of 5G and discontinuous CA across 4G bands, but also meet the requirements of high linearity in 2G scenarios, with lower power consumption and a smaller area.

Figure 4:
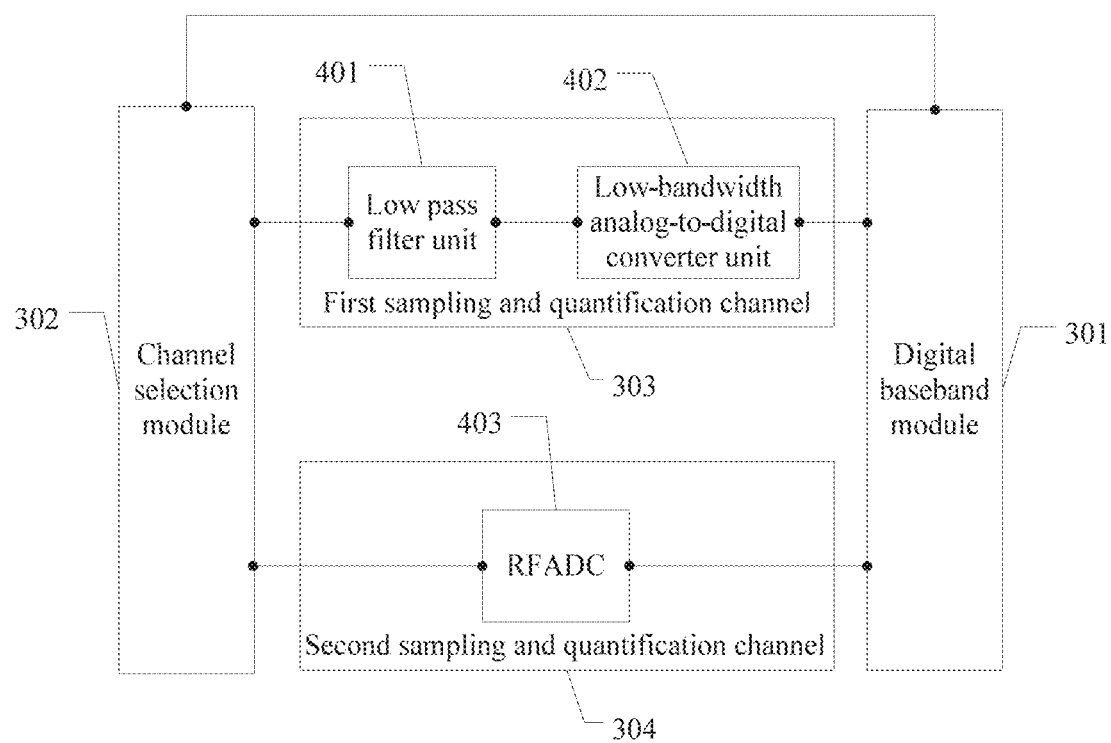
FIG. 4 is a schematic structural diagram of another embodiment of a communications chip structure according to this application.

As shown in FIG. 4, in some embodiments of this application, the first sampling and quantification channel 303 includes:

a low pass filter unit 401 and a low-bandwidth analog-to-digital converter unit 402, where the low pass filter unit 401 is connected to the channel selection module 302 and the low-bandwidth analog-to-digital converter unit 402;

the low pass filter unit 401 is configured to filter the input signal; and the low-bandwidth analog-to-digital converter unit 402 is configured to sample and quantify the filtered input signal.

In this embodiment of this application, because the first sampling and quantification channel 303 is configured to process signals of the preset narrow bandwidth span, and a signal of the preset narrow bandwidth span may specifically be a signal in a 2G, 3G, 4G single-carrier, or 4G continuous CA scenario, the first sampling and quantification channel 303 needs to include the low pass filter unit 401 and the low-bandwidth analog-to-digital converter unit 402. The low pass filter unit 401 is configured to filter the input signal to remove an interference signal, and the low-bandwidth analog-to-digital converter unit 402 is configured to sample and quantify the filtered input signal.

It should be noted that, in specific implementation, due to sampling techniques and Σ-Δ modulation techniques, a proportion of digital circuits in a system can be increased, a proportion of analog circuits can be decreased, and monolithic integration with a digital system is easy to implement. Because a high-precision A/D converter can be achieved at relatively low costs, using a CT sigma-delta ADC as the low-bandwidth analog-to-digital converter unit 402 may be an optimal choice.

As shown in FIG. 4, in some embodiments of this application, the second sampling and quantification channel 303 includes:

an RFADC 403, configured to sample and quantify the input signal.

In this embodiment of this application, because the second sampling and quantification channel 303 processes signals of the preset wide bandwidth span, the second sampling and quantification channel may specifically use the RFADC, where the RFADC can perform digital quantification for a signal bandwidth of hundreds of MHz.

Figure 5:
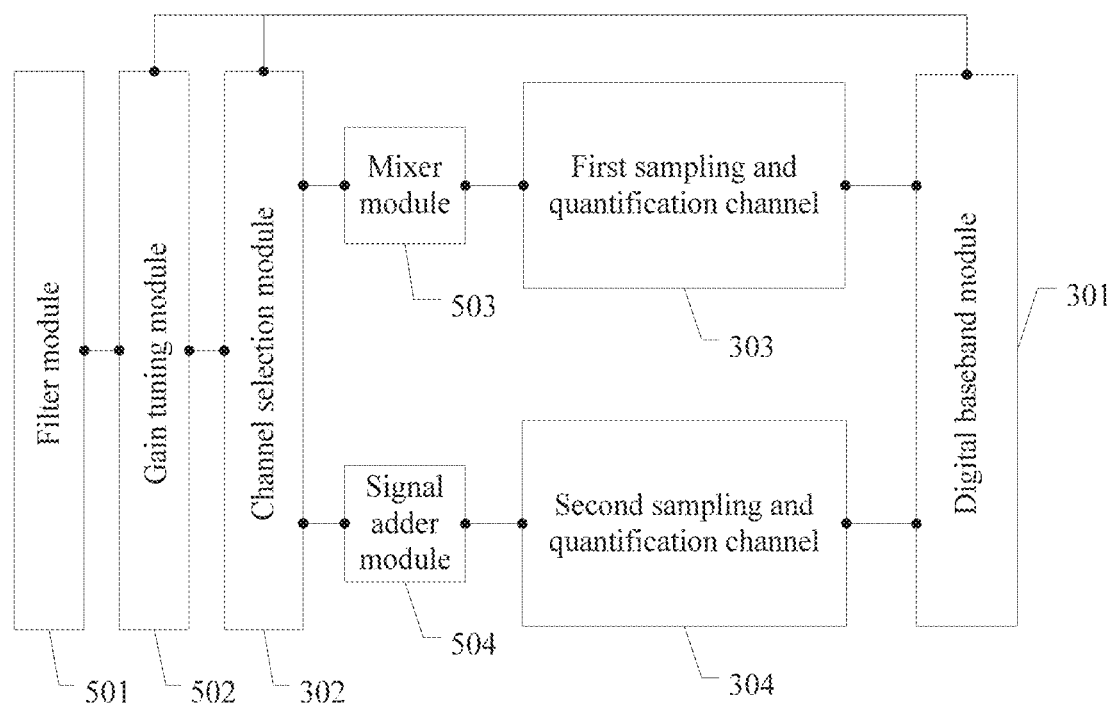
FIG. 5 is a schematic structural diagram of still another embodiment of a communications chip structure according to this application.

As shown in FIG. 5, in some embodiments of this application, the communications chip structure further includes:

a filter module 501, a gain tuning module 502, a mixer module 503, and a signal adder module 504, where the filter module 501 is connected to the gain tuning module 502; the gain tuning module 502 is connected to the digital baseband module 301 and the channel selection module 302; the mixer module 503 is between the channel selection module 302 and the first sampling and quantification channel 304; and the signal adder module 504 is between the channel selection module 302 and the second sampling and quantification channel 303.

The filter module 501 is configured to receive an original signal, and filter the original signal to obtain at least one sub-signal, where none of the at least one sub-signal share a same band.

The gain tuning module 502 is configured to receive the at least one sub-signal.

The digital baseband module 301 is further configured to control a gain tuning operation of the gain tuning module 502.

The gain tuning module 502 is further configured to tune a gain of the at least one sub-signal based on the gain tuning operation to obtain an input signal, and send the input signal to the channel selection module 302, where the input signal includes at least one input sub-signal.

The mixer module 503 is configured to receive the input signal sent by the channel selection module 302, and modulate a frequency band of the input signal to a baseband.

The signal adder module 504 is configured to receive the input signal sent by the channel selection module 302, and add up at least one input sub-signal of the input signal.

In this embodiment of this application, the input signal can be directly sampled and quantified by the first sampling and quantification channel and the second sampling and quantification channel. In some embodiments, the original signal cannot be directly used for sampling and quantification. Therefore, the communications chip structure further includes the filter module 501, the gain tuning module 502, the mixer module 503, and the signal adder module 504. The filter module 501 receives the original signal, and filters the original signal to obtain at least one sub-signal, where none of the at least one sub-signal share a same band. Generally, the filtering may be performed according to a rule of low band, medium band, high band, and ultra-high band, to obtain four sub-signals. The gain tuning module 502 receives at least one sub-signal, and sends the at least one sub-signal to the channel selection module 302. The digital baseband module 301 controls the gain tuning operation of the gain tuning module 502. The gain tuning module tunes the gain of the at least one sub-signal based on the gain tuning operation to obtain the input signal, and sends the input signal to the channel selection module 302, where the input signal includes at least one input sub-signal. The mixer module 503 receives the input signal sent by the channel selection module, and modulates the frequency band of the input signal to the baseband, for convenience of the first sampling and quantification channel 303 to perform sampling and quantification. The signal adder module 504 receives the input signal sent by the channel selection module, and adds up the at least one input sub-signal for convenience of the second sampling and quantification channel 304 to perform sampling and quantification.

In some embodiments, as shown in FIG. 5, the filter module 501 includes N filters, the gain tuning module 502 includes N gain tuning units, the channel selection module 302 includes N selection switches, the mixer module 503 includes N mixers, and the first sampling and quantification channel 303 includes N low pass filter units and N low-bandwidth analog-to-digital converter units.

In this embodiment of this application, it is assumed that the filter module 501 specifically includes N filters. Then, in filtering the original signal to obtain N sub-signals, gain tuning needs to be performed on each sub-signal. Therefore, the gain tuning module 502 includes N gain tuning units, corresponding to channel selection functions of the channel selection module 303, where the channel selection module 303 includes N selection switches. When the channel selection module 303 selects the first sampling and quantification channel, one selection switch outputs one sub-signal to one mixer in the mixer module 503, where the mixer module includes N mixers. The first sampling and quantification channel samples and quantifies each input sub-signal of the input signal separately. Therefore, the first sampling and quantification channel includes N low pass filter units and N low-bandwidth analog-to-digital converter units.

Figure 6:
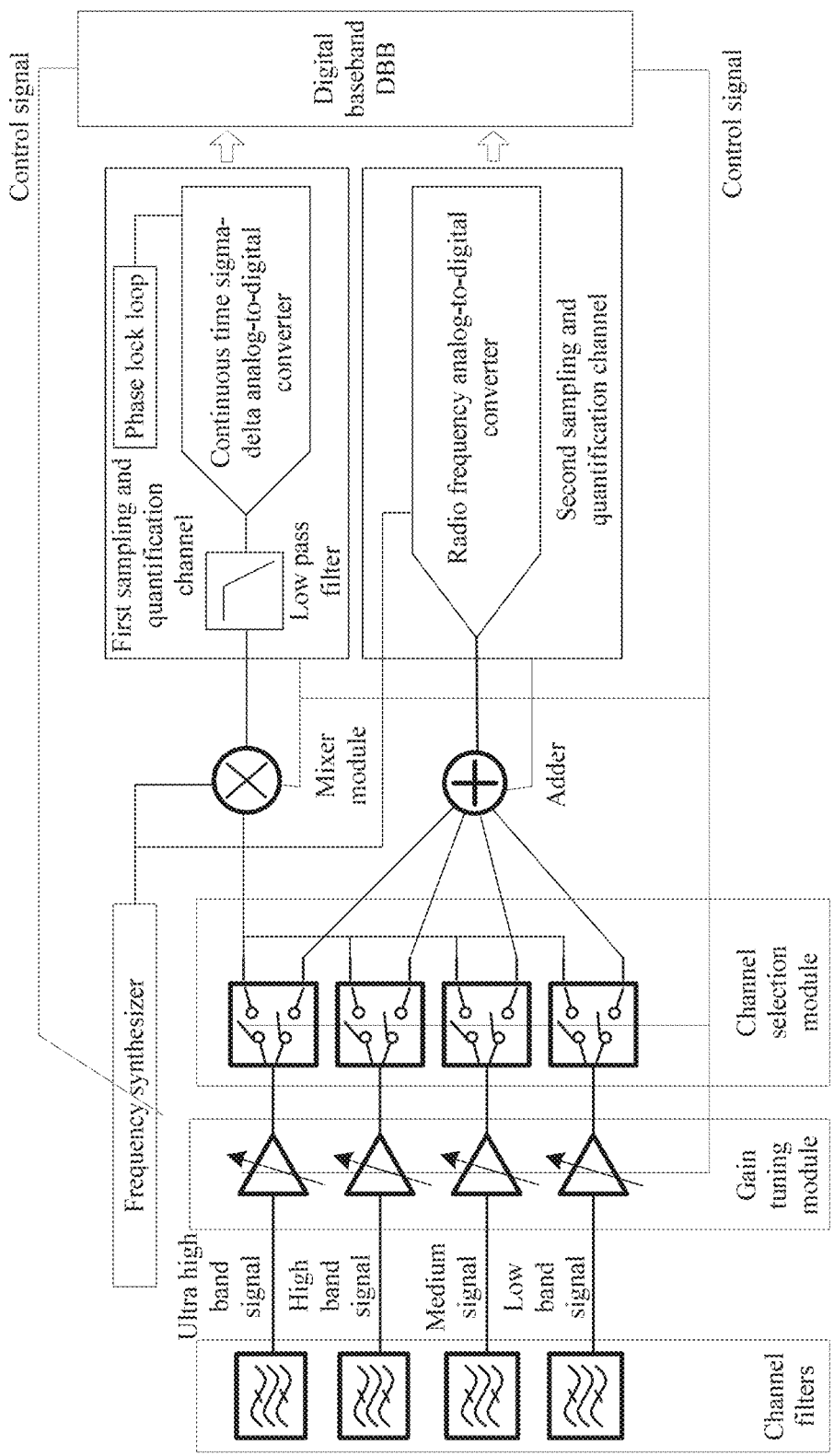
FIG. 6 is a schematic structural diagram of a specific example of a communications chip structure according to this application.

FIG. 6 is a schematic structural diagram of a specific example of the communications chip structure according to this application. As shown in FIG. 6, an original signal passes a filter module (Channel Filters) and is divided into four band signals, including a low band signal (LB), a medium band signal (MB), a high band signal (HB), and an ultra-high band signal (UHB). Controlled by a digital baseband module, each signal passes a gain tuning module, with an amplitude enlarged to a required magnitude. A channel selection module (DeMux) processes the signal specifically to scenarios: (1) For 2G, 3G, 4G single-carrier, and 4G continuous CA scenarios, the signal is modulated to a baseband by a mixer (Mixer), and selectively enters a first sampling and quantification channel. In this channel, the signal passes an LPF and is quantified by a CT sigma-delta ADC. In these scenarios, a signal adder module and a second sampling and quantification channel are not working, thereby saving power consumption. (2) For a scenario of discontinuous CA across 4G bands, the signal selectively enters the second sampling and quantification channel. Before entering this channel, a plurality of signals are processed by the adder into one signal, and the one signal is sent to an RFADC for quantification. In this scenario, the mixer and the first sampling and quantification channel are not working, thereby saving power consumption. A frequency synthesizer provides a local oscillator clock and a sampling clock for the mixer and the RFADC respectively. The gain tuning module, the channel selection module, and the frequency synthesizer are all controlled by a DBB output signal. A PLL provides a working clock for the CT sigma-delta ADC.

It should be noted that the gain tuning module, the DeMux, and the adder in FIG. 6 may be designed integratively to optimize a structure and performance. The LPF in FIG. 6 may be fused into the CT sigma-delta ADC.

The foregoing embodiments introduce the communications chip structure in this application. The following describes a signal processing method applied to such communications chip structure.

Figure 7:
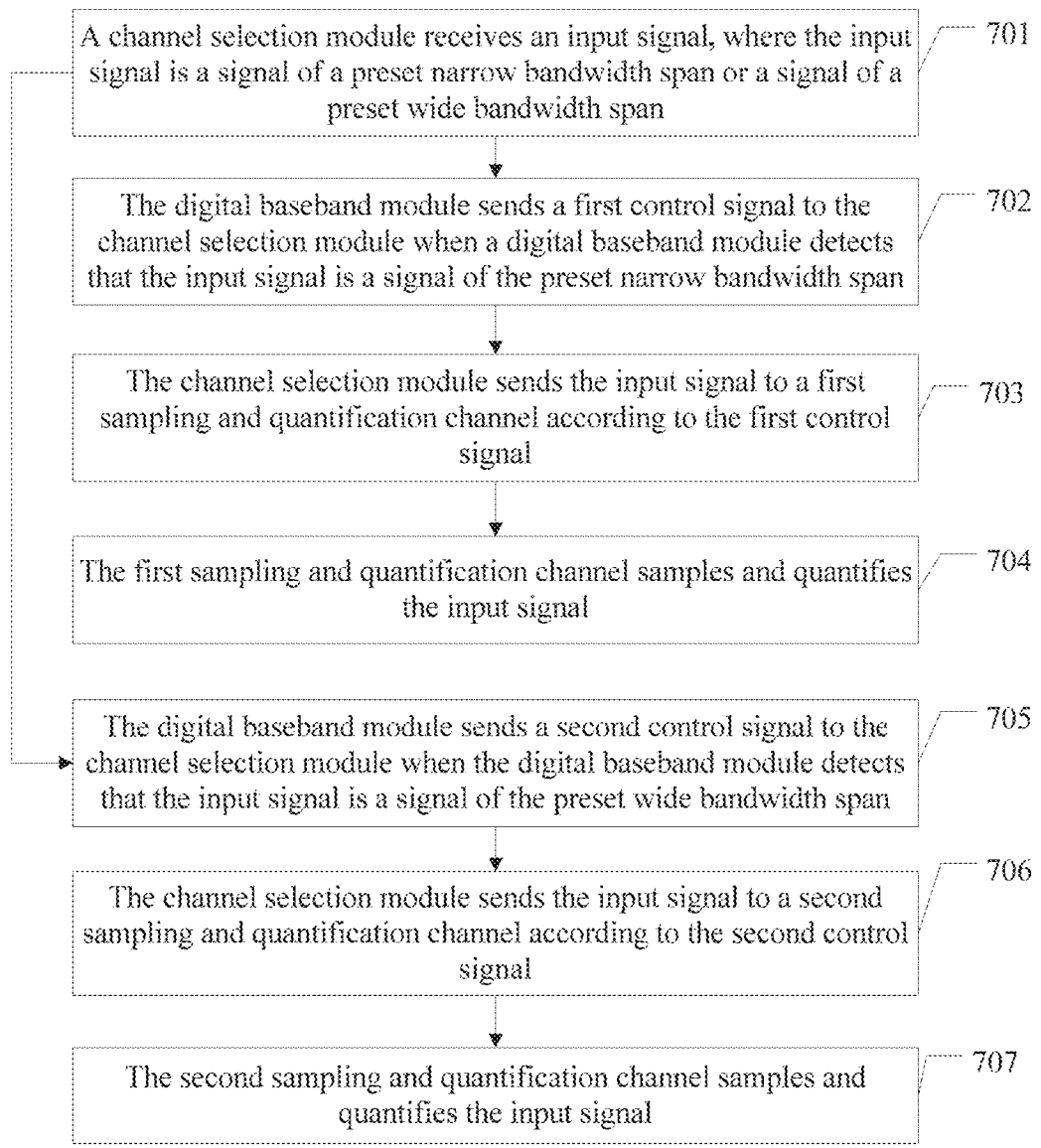
FIG. 7 is a schematic flowchart of an embodiment of a signal processing method according to this application.

As shown in FIG. 7, this application provides a signal processing method, applied to the communications chip structure shown in FIG. 3. The method includes the following operations.

701. A channel selection module receives an input signal, where the input signal is a signal of a preset narrow bandwidth span or a signal of a preset wide bandwidth span.

In this embodiment, the communications chip structure is known to include a digital baseband module, the channel selection module, a first sampling and quantification channel, and a second sampling and quantification channel. The first sampling and quantification channel is configured to sample and quantify signals of the preset narrow bandwidth span, where a signal of the preset narrow bandwidth span may specifically be a signal in a 2G, 3G, 4G single-carrier, or 4G continuous CA scenario. Signal bandwidth spans in these scenarios are relatively narrow, generally less than 200 MHz. Therefore, a criterion for a signal of the preset narrow bandwidth span may be a preset narrow bandwidth span less than 200 MHz. The second sampling and quantification channel is configured to sample and quantify signals of the preset wide bandwidth span, where a signal of the preset wide bandwidth span may specifically be a signal in a scenario of 5G or discontinuous CA across 4G bands. Signal bandwidth spans in the scenarios of 5G and discontinuous CA across 4G bands are relatively large, definitely larger than that of a signal of the preset narrow bandwidth span. The channel selection module receives the input signal, where the input signal is a signal of the preset narrow bandwidth span or a signal of the preset wide bandwidth span.

702. The digital baseband module sends a first control signal to the channel selection module when the digital baseband module detects that the input signal is a signal of the preset narrow bandwidth span.

In this embodiment, when the digital baseband module detects that the input signal is a signal of the preset narrow bandwidth span, the digital baseband module sends the first control signal to the channel selection module. The first control signal is used to control the channel selection module to select the first sampling and quantification channel.

703. The channel selection module sends the input signal to the first sampling and quantification channel according to the first control signal.

In this embodiment, after receiving the first control signal sent by the digital baseband module, the channel selection module sends the input signal to the first sampling and quantification channel according to the first control signal.

704. The first sampling and quantification channel samples and quantifies the input signal.

705. The digital baseband module sends a second control signal to the channel selection module when the digital baseband module detects that the input signal is a signal of the preset wide bandwidth span.

In this embodiment, when the digital baseband module detects that the input signal is a signal of the preset wide bandwidth span, the digital baseband module sends the second control signal to the channel selection module. The second control signal is used to control the channel selection module to select the second sampling and quantification channel.

706. The channel selection module sends the input signal to the second sampling and quantification channel according to the second control signal.

In this embodiment, after receiving the second control signal sent by the digital baseband module, the channel selection module sends the input signal to the second sampling and quantification channel according to the second control signal.

707. The second sampling and quantification channel samples and quantifies the input signal.

In this embodiment of this application, when the input signal is a signal of the preset narrow bandwidth span, the first sampling and quantification channel can sample and quantify the signal of the preset narrow bandwidth span, while the second sampling and quantification channel does not need to perform any processing. Compared with the prior-art first implementation, such implementation has same power consumption and performance. When the input signal is a signal of the preset wide bandwidth span, the second sampling and quantification channel can sample and quantify the signal of the preset wide bandwidth span, while the first sampling and quantification channel does not need to perform any processing. Compared with the prior-art second implementation, such implementation does not need to support requirements of high linearity in 2G scenarios, but only needs to support large-bandwidth input, reducing power consumption and an area of the second sampling and quantification channel. Therefore, the communications chip structure can not only support large-bandwidth input in scenarios of 5G and discontinuous CA across 4G bands, but also meet the requirements of high linearity in 2G scenarios, with lower power consumption and a smaller area.

In some embodiments of this application, the first sampling and quantification channel includes a low pass filter unit and a low-bandwidth analog-to-digital converter unit, and that the first sampling and quantification channel samples and quantifies the input signal includes:

filtering, by the low pass filter unit, the input signal; and sampling and quantifying, by the low-bandwidth analog-to-digital converter unit, the filtered input signal.

In this embodiment of this application, because the first sampling and quantification channel is configured to process signals of the preset narrow bandwidth span, and a signal of the preset narrow bandwidth span may specifically be a signal in a 2G, 3G, 4G single-carrier, or 4G continuous CA scenario, the first sampling and quantification channel needs to include the low pass filter unit and the low-bandwidth analog-to-digital converter unit. The low pass filter unit is configured to filter the input signal to remove an interference signal, and the low-bandwidth analog-to-digital converter unit is configured to sample and quantify the filtered input signal.

In some embodiments of this application, the low-bandwidth analog-to-digital converter unit is a CT sigma-delta ADC.

In this embodiment of this application, due to sampling techniques and Σ-Δ modulation techniques, a proportion of digital circuits in a system can be increased, a proportion of analog circuits can be decreased, and monolithic integration with a digital system is easy to implement. Because a high-precision A/D converter can be achieved at relatively low costs, using a CT sigma-delta ADC as the low-bandwidth analog-to-digital converter unit may be an optimal choice.

In some embodiments of this application, the second sampling and quantification channel includes an RFADC, and that the second sampling and quantification channel samples and quantifies the input signal includes:

sampling and quantifying, by the RFADC, the input signal.

In this embodiment of this application, because the second sampling and quantification channel processes signals of the preset wide bandwidth span, the second sampling and quantification channel may specifically use the RFADC, where the RFADC can perform digital quantification for a signal bandwidth of hundreds of MHz.

In some embodiments of this application, the communications chip structure further includes a filter module, a gain tuning module, and a mixer module, and before the channel selection module receives the input signal, the signal processing method further includes:

receiving, by the filter module, an original signal, and filtering the original signal to obtain at least one sub-signal, where none of the at least one sub-signal share a same band;

receiving, by the gain tuning module, the at least one sub-signal;

sending, by the digital baseband module, a third control signal to the gain tuning module, where the third control signal is used to control a gain tuning operation of the gain tuning module; and tuning, by the gain tuning module, a gain of the at least one sub-signal based on the gain tuning operation to obtain an input signal, and sending the input signal to the channel selection module, where the input signal includes at least one input sub-signal.

In this embodiment of this application, the input signal is not obtained directly. Generally, what the communications chip structure obtains is an original signal. In some embodiments, the original signal cannot be directly sampled and quantified. Therefore, the communications chip structure further includes the filter module, the gain tuning module, and the mixer module. Before the channel selection module receives the input signal, the filter module receives the original signal, and filters the original signal to obtain at least one sub-signal, where none of the at least one sub-signal share a same band. Generally, the filtering may be performed according to a rule of low band, medium band, high band, and ultra-high band, to obtain four sub-signals. The gain tuning module receives the at least one sub-signal. The digital baseband module sends the third control signal to the gain tuning module, where the third control signal is used to control the gain tuning operation of the gain tuning module. The gain tuning module tunes the gain of the at least one sub-signal based on the gain tuning operation to obtain the input signal, and sends the input signal to the channel selection module, where the input signal includes at least one input sub-signal.

In some embodiments of this application, the communications chip structure further includes a mixer module, and before the first sampling and quantification channel samples and quantifies the input signal, the signal processing method further includes:

modulating, by the mixer module, a frequency band of the input signal to a baseband after the mixer module receives the input signal sent by the channel selection module.

In this embodiment of this application, before the first sampling and quantification channel samples and quantifies the input signal, because the frequency band of the input signal is not the same as the baseband of the digital baseband module, band mixing needs to be performed to facilitate the sampling and quantification. Specifically, such mixing may be that the mixer module receives the input signal sent by the channel selection module, and modulates the frequency band of the input signal to the baseband.

In some embodiments of this application, the communications chip structure also includes a signal adder module, and before the second sampling and quantification channel samples and quantifies the input signal, the signal processing method further includes:

receiving, by the signal adder module, the input signal sent by the channel selection module, and adding up the at least one input sub-signal of the input signal.

Before the second sampling and quantification channel samples and quantifies the input signal, because the input signal includes a plurality of input sub-signals, the plurality of input sub-signals need to be added up into one signal to facilitate the sampling and quantification. Specifically, such addition may be that the signal adder module receives the input signal sent by the channel selection module and adds up the at least one input sub-signal of the input signal.

In this embodiment of this application, before the first sampling and quantification channel samples and quantifies the input signal, because the frequency band of the input signal is not the same as the baseband of the digital baseband module, band mixing needs to be performed to facilitate the sampling and quantification. Specifically, such mixing may be that the mixer module receives the input signal sent by the channel selection module, and modulates the frequency band of the input signal to the baseband.

This application also provides a computer-readable storage medium. The computer-readable storage medium stores an instruction. When the instruction is run on a computer, the computer is enabled to perform the signal processing method described in the foregoing embodiments.

This application also provides a computer program product including an instruction. When the computer program product is run on a computer, the computer is enabled to perform the signal processing method described in the foregoing embodiments.

All or some of the foregoing embodiments may be implemented by using software, hardware, firmware, or any combination thereof. When software is used for implementation, the embodiments may be implemented completely or partially in a form of a computer program product.

The computer program product includes one or more computer instructions. When the computer program instructions are loaded and executed on a computer, the procedure or functions according to the embodiments of this application are completely or partially generated. The computer may be a general-purpose computer, a dedicated computer, a computer network, or other programmable apparatuses. The computer instructions may be stored in a computer-readable storage medium or may be transmitted from one computer-readable storage medium to another computer-readable storage medium. For example, the computer instructions may be transmitted from a website, computer, server, or data center to another website, computer, server, or data center in a wired (for example, through a coaxial cable, an optical fiber, or a digital subscriber line (DSL)) or wireless (for example, through infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state disk Solid State Disk (SSD)), or the like.

It should be understood that, in the embodiments of this application, the sequence numbers of the foregoing processes do not indicate any execution sequences, and should not be construed as any limitation on the implementation processes of the embodiments of this application. The execution sequences of the processes should be determined based on functions and internal logic of the processes.

In conclusion, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A communications chip structure, comprising:
a digital baseband module, a channel selection module, a first sampling and quantification channel, and a second sampling and quantification channel, wherein the first sampling and quantification channel is configured to sample and quantify signals of a preset narrow bandwidth span; and the second sampling and quantification channel is configured to sample and quantify signals of a preset wide bandwidth span;
the first sampling and quantification channel and the second sampling and quantification channel are connected to the channel selection module and the digital baseband module, and the channel selection module is connected to the digital baseband module;
the channel selection module is configured to receive an input signal, wherein the input signal is a signal of the preset narrow bandwidth span or a signal of the preset wide bandwidth span;
the digital baseband module is configured to control the channel selection module to select the first sampling and quantification channel when the input signal is a signal of the preset narrow bandwidth span;
the digital baseband module is further configured to control the channel selection module to select the second sampling and quantification channel when the input signal is a signal of the preset wide bandwidth span; and
the channel selection module is further configured to send the input signal to the first sampling and quantification channel or the second sampling and quantification channel, so that the first sampling and quantification channel or the second sampling and quantification channel samples and quantifies the input signal.

2. The communications chip structure according to claim 1, wherein the first sampling and quantification channel comprises:
a low pass filter unit and a low-bandwidth analog-to-digital converter unit, wherein
the low pass filter unit is connected to the channel selection module and the low-bandwidth analog-to-digital converter unit;
the low pass filter unit is configured to filter the input signal; and
the low-bandwidth analog-to-digital converter unit is configured to sample and quantify the filtered input signal.

3. The communications chip structure according to claim 2, wherein
the low-bandwidth analog-to-digital converter unit is a continuous time sigma-delta analog-to-digital converter CT sigma-delta ADC.

4. The communications chip structure according to claim 1, wherein the second sampling and quantification channel comprises:
a radio frequency analog-to-digital converter RFADC, configured to sample and quantify the input signal.

5. The communications chip structure according to claim 1, wherein the communications chip structure further comprises:
a filter module, a gain tuning module, a mixer module, and a signal adder module, wherein
the filter module is connected to the gain tuning module, and the gain tuning module is connected to the digital baseband module and the channel selection module; the mixer module is between the channel selection module and the first sampling and quantification channel, and the signal adder module is between the channel selection module and the second sampling and quantification channel;
the filter module is configured to receive an original signal, and filter the original signal to obtain at least one sub-signal, wherein none of the at least one sub-signal shares a same band;
the gain tuning module is configured to receive the at least one sub-signal;
the digital baseband module is further configured to control a gain tuning operation of the gain tuning module;
the gain tuning module is further configured to tune a gain of the at least one sub-signal based on the gain tuning operation to obtain an input signal, and send the input signal to the channel selection module, wherein the input signal comprises at least one input sub-signal;

the mixer module is configured to receive the input signal sent by the channel selection module, and modulate a frequency band of the input signal to a baseband; and the signal adder module is configured to receive the input signal sent by the channel selection module, and add up the at least one input sub-signal of the input signal.

6. The communications chip structure according to claim 5, wherein the filter module comprises N filters; the gain tuning module comprises N gain tuning units; the channel selection module comprises N selection switches; the mixer module comprises N mixers; and the first sampling and quantification channel comprises N low pass filter units and N low-bandwidth analog-to-digital converter units.

7. A signal processing method comprising:

receiving, by a channel selection module, an input signal, wherein the input signal is a signal of a preset narrow bandwidth span or a signal of a preset wide bandwidth span;

sending, by a digital baseband module, a first control signal to the channel selection module when the digital baseband module detects that the input signal is a signal of the preset narrow bandwidth span;

sending, by the channel selection module, the input signal to a first sampling and quantification channel according to the first control signal, and sampling and quantifying, by the first sampling and quantification channel, the input signal; or sending, by the digital baseband module, a second control signal to the channel selection module when the digital baseband module detects that the input signal is a signal of the preset wide bandwidth span, sending, by the channel selection module, the input signal to a second sampling and quantification channel according to the second control signal, and sampling and quantifying, by the second sampling and quantification channel, the input signal, wherein the signal processing method is applied to a communications chip structure, wherein the communications chip structure comprises the digital baseband module, the channel selection module, the first sampling and quantification channel, and the second sampling and quantification channel, wherein the first sampling and quantification channel is configured to sample and quantify signals of the preset narrow bandwidth span, and the second sampling and quantification channel is configured to sample and quantify signals of the preset wide bandwidth span.

8. The signal processing method according to claim 7, wherein the first sampling and quantification channel comprises a low pass filter unit and a low-bandwidth analog-to-digital converter unit; and the sampling and quantifying, by the first sampling and quantification channel, the input signal, comprises:

filtering, by the low pass filter unit, the input signal; and sampling and quantifying, by the low-bandwidth analog-to-digital converter unit, the filtered input signal.

9. The signal processing method according to claim 8, wherein the low-bandwidth analog-to-digital converter unit is a continuous time sigma-delta analog-to-digital converter CT Sigma-delta ADC.

10. The signal processing method according to claim 7, wherein the second sampling and quantification channel comprises a radio frequency analog-to-digital converter RFADC, and the sampling and quantifying, by the second sampling and quantification channel, the input signal, comprises:

sampling and quantifying, by the RFADC, the input signal.

11. The signal processing method according to claim 7, wherein the communications chip structure further comprises a filter module and a gain tuning module; and before the receiving, by the channel selection module, an input signal, the method further comprises:

receiving, by the filter module, an original signal, and filtering the original signal to obtain at least one sub-signal, wherein none of the at least one sub-signal shares a same band;

receiving, by the gain tuning module, the at least one sub-signal;

sending, by the digital baseband module, a third control signal to the gain tuning module, wherein the third control signal is used to control a gain tuning operation of the gain tuning module; and tuning, by the gain tuning module, a gain of a gain of the at least one sub-signal based on the gain tuning operation to obtain an input signal, and sending the input signal to the channel selection module, wherein the input signal comprises at least one input sub-signal.

12. The signal processing method according to claim 11, wherein the communications chip structure further comprises a mixer module; and before the sampling and quantifying, by the first sampling and quantification channel, the input signal, the method further comprises:

receiving, by the mixer module, the input signal sent by the channel selection module, and modulating a frequency band of the input signal to a baseband.

13. The signal processing method according to claim 11, wherein the communications chip structure further comprises a signal adder module; and before the sampling and quantifying, by the second sampling and quantification channel, the input signal, the method further comprises:

receiving, by the signal adder module, the input signal sent by the channel selection module, and adding up at least one input sub-signal of the input signal.

* * * * *